United States Patent
Cranford, Jr. et al.

(10) Patent No.: US 7,352,755 B2
(45) Date of Patent: Apr. 1, 2008

(54) NETWORK INTERFACE CARD (NIC) WITH PHASE LOCK RISE TIME CONTROL GENERATING CIRCUIT

(75) Inventors: Hayden Clay Cranford, Jr., Apex, NC (US); Raymond Paul Rizzo, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1038 days.

(21) Appl. No.: 10/462,852

(22) Filed: Jun. 17, 2003

(65) Prior Publication Data

US 2003/0198237 A1    Oct. 23, 2003

Related U.S. Application Data

(62) Division of application No. 09/160,907, filed on Sep. 25, 1998, now Pat. No. 6,721,379.

(51) Int. Cl.
  *H04L 12/66*  (2006.01)
  *H03D 3/24*   (2006.01)
  *H03L 7/06*   (2006.01)

(52) U.S. Cl. ............ 370/401; 370/463; 375/376; 329/149; 329/156

(58) Field of Classification Search ........... 370/401, 370/463; 375/376; 327/149, 158
See application file for complete search history.

(56) References Cited

U.S. PATENT DOCUMENTS

| | | | | |
|---|---|---|---|---|
| 3,999,111 A * | 12/1976 | Bailey | ............ | 363/27 |
| 5,034,813 A | 7/1991 | Dolazza et al. | ...... | 375/240.01 |
| 5,185,538 A | 2/1993 | Kondoh et al. | ........ | 307/270 |
| 5,365,513 A * | 11/1994 | Copley et al. | ........ | 370/253 |
| 5,394,114 A | 2/1995 | Davis | ............ | 331/1 A |
| 5,440,514 A | 8/1995 | Flannagan | ............ | 365/194 |
| 5,440,515 A | 8/1995 | Chang et al. | ............ | 365/194 |
| 5,442,629 A | 8/1995 | Geyer et al. | ............ | 370/84 |
| 5,444,695 A * | 8/1995 | Copley et al. | ............ | 370/452 |
| 5,479,124 A | 12/1995 | Pun et al. | ............ | 327/108 |
| 5,537,068 A | 7/1996 | Konno | ............ | 327/115 |
| 5,563,526 A | 10/1996 | Hastings et al. | ............ | 326/37 |
| 5,568,064 A | 10/1996 | Beers et al. | ............ | 326/31 |
| 5,604,775 A | 2/1997 | Saitoh et al. | ............ | 375/376 |
| 5,608,876 A | 3/1997 | Cohen et al. | ............ | 395/281 |
| 5,687,202 A | 11/1997 | Eitrheim | ............ | 375/376 |
| 5,687,330 A | 11/1997 | Gist et al. | ............ | 395/309 |
| 5,740,213 A | 4/1998 | Dreyer | ............ | 327/157 |
| 5,818,270 A | 10/1998 | Hamza | ............ | 327/116 |
| 5,990,714 A | 11/1999 | Takahashi | ............ | 327/149 |
| 6,012,099 A * | 1/2000 | Chung | ............ | 709/249 |
| 6,037,812 A | 3/2000 | Gaudet | ............ | 327/116 |
| 6,043,717 A | 3/2000 | Kurd | ............ | 327/157 |
| 6,061,350 A * | 5/2000 | Min | ............ | 370/389 |
| 6,087,868 A | 7/2000 | Millar | ............ | 327/156 |
| 6,104,223 A | 8/2000 | Chapman et al. | ............ | 327/276 |
| 6,122,667 A * | 9/2000 | Chung | ............ | 709/228 |
| 6,208,616 B1 * | 3/2001 | Mahalingam et al. | ....... | 370/216 |

(Continued)

Primary Examiner—Alpus H. Hsu
(74) Attorney, Agent, or Firm—Joscelyn G. CockBurn

(57) ABSTRACT

A Network Interface Card (NIC) for attaching data terminal equipment to a communications network. The NIC includes a Phase Lock Loop (PLL) with a master delay structure that is operatively coupled to at least one delay line structure. The PLL generates control pulses at precise delayed intervals that are used to gate data through said at least one delay line structure.

13 Claims, 12 Drawing Sheets

U.S. PATENT DOCUMENTS

| | | | |
|---|---|---|---|
| 6,249,164 B1 | 6/2001 | Cranford et al. | 327/270 |
| 6,317,161 B1 | 11/2001 | Renner et al. | 348/536 |
| 6,330,034 B1 | 12/2001 | Renner et al. | 348/536 |
| 6,348,823 B1 | 2/2002 | Pan | 327/159 |
| 6,377,640 B2 * | 4/2002 | Trans | 375/354 |
| 6,392,458 B1 | 5/2002 | Miller et al. | 327/158 |
| 6,504,851 B1 * | 1/2003 | Abler et al. | 370/466 |
| 6,956,853 B1 * | 10/2005 | Connery et al. | 370/392 |

* cited by examiner

NETWORK INTERFACE CARD (NIC) WITH PHASE LOCK RISE TIME CONTROL GENERATING CIRCUIT

CROSS REFERENCE TO RELATED PATENT APPLICATION

The present application is a Divisional of U.S. Pat. No. 6,721,379, Ser. No. 09/160,907, filed Sep. 25, 1998 and assign to the assignee of the present invention. The present application claims priority of U.S. Pat. No. 6,721,379.

The present patent application relates to patent application Ser. No. 09/160,802, filed currently herewith and assigned to the assignee of the present invention.

BACKGROUND OF THE INVENTION

1. Field of the Invention

The present invention relates to communications network in general and, in particular, to circuit arrangements for generating signals for transmission on said communications network.

2. Prior Art

The use of circuit arrangements to generate signal waveforms is well known in the prior art. The signal waveforms can be used to transmit information on busses, communications media and/or control writing and/or reading information into/from memories. Usually, the signal waveforms are in the form of voltages.

Several design criteria have to be addressed in order to provide acceptable waveform generating circuits. For example, if the waveforms are to be used in transmitting information in a computer network, the transmission system, such as Local Area Network, etc., interconnecting the computers has to be addressed in order to design an acceptable waveform generating circuit. Usually, the characteristics, such as voltage waveforms electromagnetic emissions of the interconnecting network are set by standards. In order to be compliant, the designer is faced with the problem of adapting technologies to meet the standard requirements.

Another area of challenge is to minimize product cost. It is well recognized and understood that the low cost producer of quality products will have substantial advantages in the marketplace. One of the many ways of reducing cost is to integrate analog and digital circuits on the same substrate. The cost savings are even more substantial if the VLSI manufacturing process is friendly to the fabrication of both analog and digital devices.

Prior art approaches in developing waveform generating circuits heavily relied on magnetics or other analog techniques to provide desired wave shape. The magnetics are usually expensive and requires tuning. The net result is that the cost of the product is unnecessarily increased.

Even when the prior art uses on chip circuits, to generate a desire wave shape, the circuits usually have a high degree of analog contents and, as such, are not easily adapted to digital processes such as CMOS technology.

Examples of the prior art techniques and devices are set forth in the below listed patents.

U.S. Pat. No. 5,440,514 describes a memory with a write control delay locked loop for controlling a write cycle of the memory. The delay locked loop avoids the race condition by adjusting the write cycle time of the memory so that if one part of the write cycle timing is increased, all of the write timing margins are increased.

U.S. Pat. No. 5,563,526 describes a programmable mixed mode integrated circuit in which analog and digital circuits are provided on the same chip. The analog circuits are fabricated from traditional analog devices. Thus, it appears as if the chip could not be manufactured by a straightforward digital process.

U.S. Pat. No. 5,687,330 describes a driver circuit for a bus in which the rise and fall of the output signal from the driver circuit is controlled by a register external to the driver circuit.

Still other prior art patents relating to waveform generation includes U.S. Pat. Nos. 5,185,538; 5,440,515; 5,479,124 and 5,684,064. Even though the patents are believed to work well for their intended purposes, they do not address the problems discussed above or control wave shaping as tightly as it is controlled by the present invention.

For high speed (100 Mbps through gigabits) data transmissions, it is imperative that the waveform be tightly controlled or else the require data speed cannot be attained. Consequently, there is a need for a circuit arrangement that provides tightly controlled waveforms.

SUMMARY OF THE INVENTION

It is one object of the present invention to integrate waveform generating circuits with digital circuitry on the same chip.

It is another object to provide the integrated chip at a cost that is substantially lower than was heretofore been possible.

It is still another object of the present invention to generate transmitted waveforms having precise rise and fall times as specified by any one of the several standards such as ANSI, IEEE, ATM, etc.

The waveform generating system, according to the teachings of the present invention, uses clocked control of master and replica delay circuits to precisely control the rise and fall time of a transmit waveform. The transmit waveform may be produced by a series of sequential over sampled and switched current sources whose timing is precisely locked to replicas and a master delay lines. The accuracy of the rise time, etc., is "locked" to the accuracy of the basic time base or clock reference. As a consequence, the VLSI manufacturing process variations, power supply variations, and temperature variations which could create unwanted timing, signal rise time, fall time, or wave shape deviations are effectively nulled out.

The foregoing and other objects, features and advantages of the invention will be more fully described in the accompanying description of the drawings.

DETAILED DESCRIPTION OF THE PREFERRED EMBODIMENT

Figure 1:
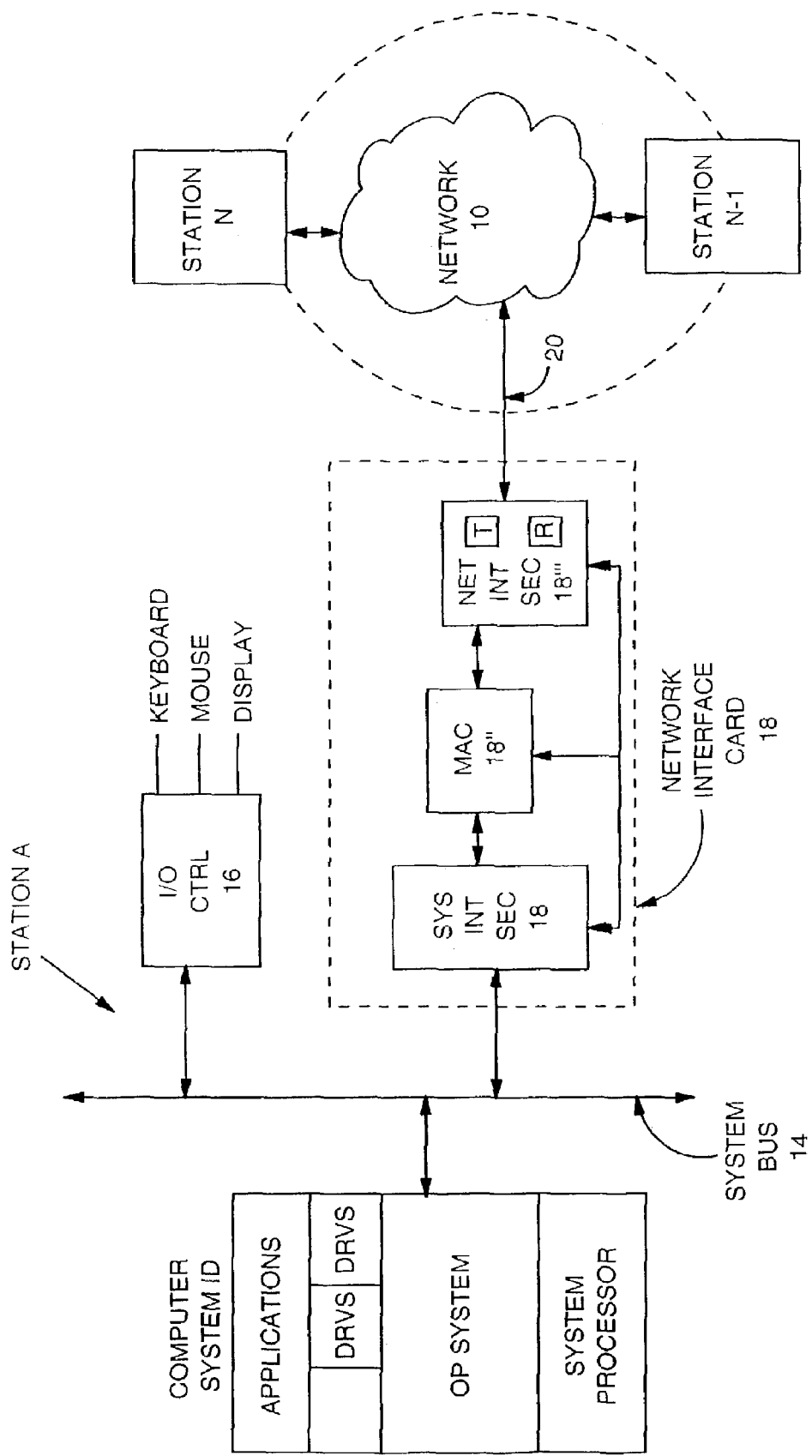
FIG. 1 shows a block diagram of a computer system including the teachings of the present invention.

FIG. 1 shows a computer network in which the present invention (described hereinafter) is included. The computer network includes Station A . . . Station N-1 . . . Station N interconnected by Network 10. The Network 10 can be a Local Area Network (LAN) such as ethernet, Token Ring, ATM, etc., or any other type of communications network. The media used to form the network could be twisted pair, coax or any other type. The stations may be personal computers, processors, servers or similar types of machines. The stations communicate with one another, through the Network 10, based on a predetermined protocol. For example, if the interconnecting network is a Token Ring, the IEEE 802.5 protocol would be used in exchanging data on the network. Similarly, if the interconnecting network is an ethernet, the collision type protocol would be used. In essence, the protocol used in the interconnecting network is indigenous to the type of network. For purposes of discussion, most of the stations on the network are substantially the same. Therefore, the description of Station A is intended to cover the structure of the other stations in the network.

It should be noted that other stations with different structures could be added to the network without deviating from the teachings of the present invention.

Still referring to FIG. 1, Station A includes a Computer System 12 connected to a System Bus 14. Computer System 12 includes a System Processor, an Operation (OP) System, a plurality of software device drivers (DRVS) and application programs. This type of computer arrangement is well known in the art, therefore further discussion will not be given. An I/O Controller 16 interconnects a plurality of I/O devices such as keyboard, mouse, display, etc., to the System Bus 14. Even though the I/O Controller 16 is shown as a single block, in reality, it could be several different controllers, each one particularly adapted for coupling special types of I/O devices to the System Bus 14.

Network Interface Card (NIC) 18 interconnects the System Bus 14 to the interconnecting Network 10. The Network Interface Card 18 includes a System Interface Section (System Interface Section) 18', a Medium Access Controller (MAC) 18", and Network Interface Section (Network Interface Section) 18'''. The NIC is connected by transmission Structure 20 to the Network 10. As will be explained subsequently, the transmission Structure 20 includes coupling devices, transmission media, which could be twisted pair or the like, to Network 10. The function of the System Interface Section 18' is to connect the NIC to the Computer System 12. To this end, the System Interface Section 18' includes electrical circuits that process data in accordance with the characteristics of the System Bus 14 to which the NIC is connected. The Medium Access Controller 18" contains circuits that provide functions and communications protocols required for the NIC to communicate with other stations on the network. For example, if the communications protocol is an ethernet protocol, then the Medium Access Controller 18" generates the function necessary to output and receive data in accordance with ethernet protocol. Likewise, if the protocol is a Token Ring, then the MAC 18" practices the Token Ring protocol, and so forth. The Network Interface Section 18''' includes circuitry for generating and receiving signals from the network. Important devices in the Network Interface Section 18''' includes a Transmitter (T) which generates the waveform to be outputted on the Network 10. The Network Interface Section 18''' also includes a Receiver (R), which receives information from the network. The use of NIC for interfacing computer systems to networks are well known in the art and further detail will not be given. Suffice it to say, the invention to be described herein resides in the transmitter portion of the network interface section. Therefore, the remaining portion of this document addresses the transmitter (hereinafter called waveform generating system) which generates waveforms in accordance with the teachings of the present invention. The waveforms are outputted on the interconnecting Network 10.

Figure 2:
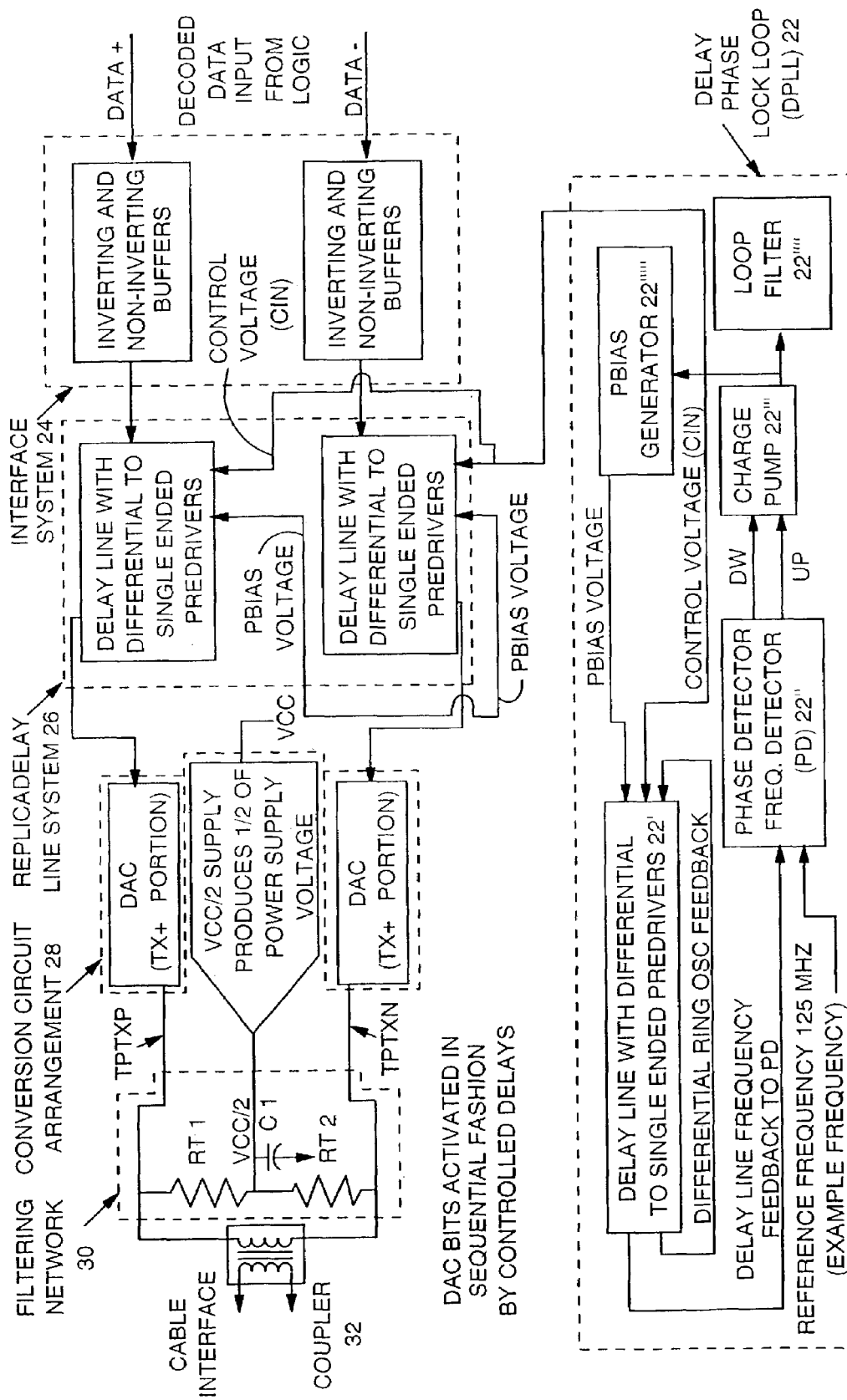
FIG. 2 shows a block diagram of the waveform generating system according to the teachings of the present invention.

FIG. 2 shows a block diagram of the waveform generating system according to the teachings of the present invention. The waveform generating system is primarily located in the transmitter in FIG. 1. The waveform generating system includes Delay Phase Lock Loop (DPLL) 22, Interface System 24, Replica Delay Line System 26, Conversion Circuit Arrangement 28, Filtering Network 30, and Coupler 32. The function of the waveform generating system is to generate a desired waveform whose contents carry information to other stations on the network.

Still referring to FIG. 2, the waveform generating system can be implemented on a module using a digital implementation process such as CMOS or can be implemented as a chip on a motherboard. The method of implementing the invention is not critical and would be well within the skill of the artisan to design a chip or similar structure based upon the disclosure in the present invention. If the waveform generating system is implemented in a chip, then only one Delay Phase Lock Loop 22 is required for the chip. The other components on the chip would require a different one for each port on the chip. For example, if the chip is a four port chip, then each port would require the Coupler 32, Filtering Network 30, Conversion Circuit Arrangement 28, Replica Delay Line System 26, and Interface System 24.

Still referring to FIG. 2, the Delay Phase Lock Loop 22 generates control pulses which are spaced at precise delay intervals from each other. As will be explained subsequently, the pulses are used to gate data through replica delay lines. In addition, it should be noted that the replica delay lines are substantially the same as the master delay line (described hereinafter). Therefore, the description of the master delay line is applicable for the description of the replica delay line. The Delay Phase Locked Loop 22 includes a Delay Line with Differential to Single ended Predrivers 22', a Phase Detector/Frequency Detector 22", a Charge Pump 22''', Loop Filter 22'''' and Pbias Generator 22'''''. The Master Delay Line 22' is configured as a ring oscillator whose output is fed back to the Phase Detector/Frequency Detector 22". A reference frequency clock of frequency 125 Mhz is fed into the Phase Detector 22' which generates up and down signals for feeding Charge Pump 22'''. The output from Charge Pump 22''' is connected to Loop Filter 22'''', Pbias Generator 22''''' and the Replica Delay Line System 26. As will be explained subsequently, the control signal from the charge pump is fed into Pbias generator and the Pbias generator uses the control signal to generate Pbias voltage for biasing the P-Channel devices in the Master Delay Line 22', and the replica delay lines in the Replica Delay Line System. It should be noted that the Phase Detector/Frequency Detector 22", the Charge Pump 22''' and Loop Filter 22'''' are standard circuit arrangements and further discussion of these components is not warranted.

Figure 3:
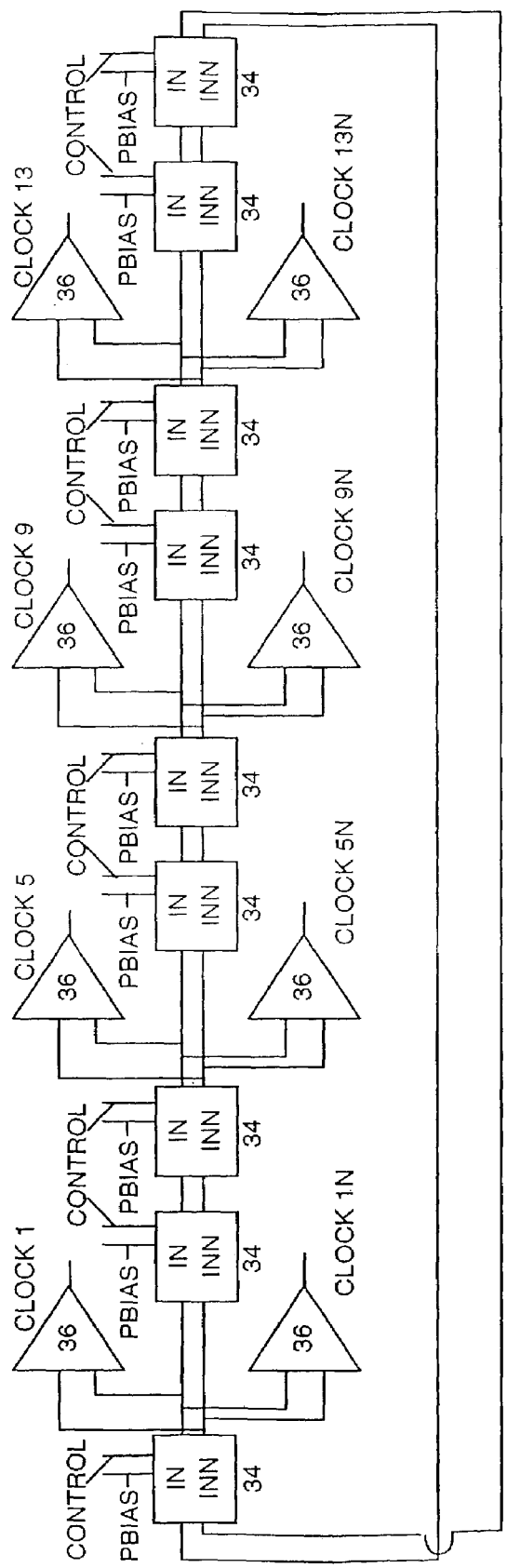
FIG. 3 shows a block diagram of the Ring Oscillator Master Delay Line System.

FIG. 3 shows a block diagram of the Master Delay Line and Differential to Single Ended Predrivers 22'. As discussed previously, the function of the Master Delay Line is to generate control pulses spaced at precise intervals from each other. The Master Delay Line includes Delay Cells 34 interconnected in a ring oscillator configuration. The outputs from one cell are connected to the input of the other cell and are labeled IN and INN. The INN represents the negative portion of the signal and IN represents the positive portion. Two other signals labeled Control and Pbias are generated by the Master PLL and the Pbias generator, respectively (details given hereinafter), and fed to each cell as shown in the figure. The outputs from selected cells are connected to dedicated predrivers identified by numeral 36. Each predriver accepts a pair of output signals from its associated delay cell converts them into a single ended clock signal which are used to drive a switch current source in the Conversion Circuit Arrangement 28. As stated above, the Replica Delay Lines are substantially identical to the Master Delay Line.

Figure 5:
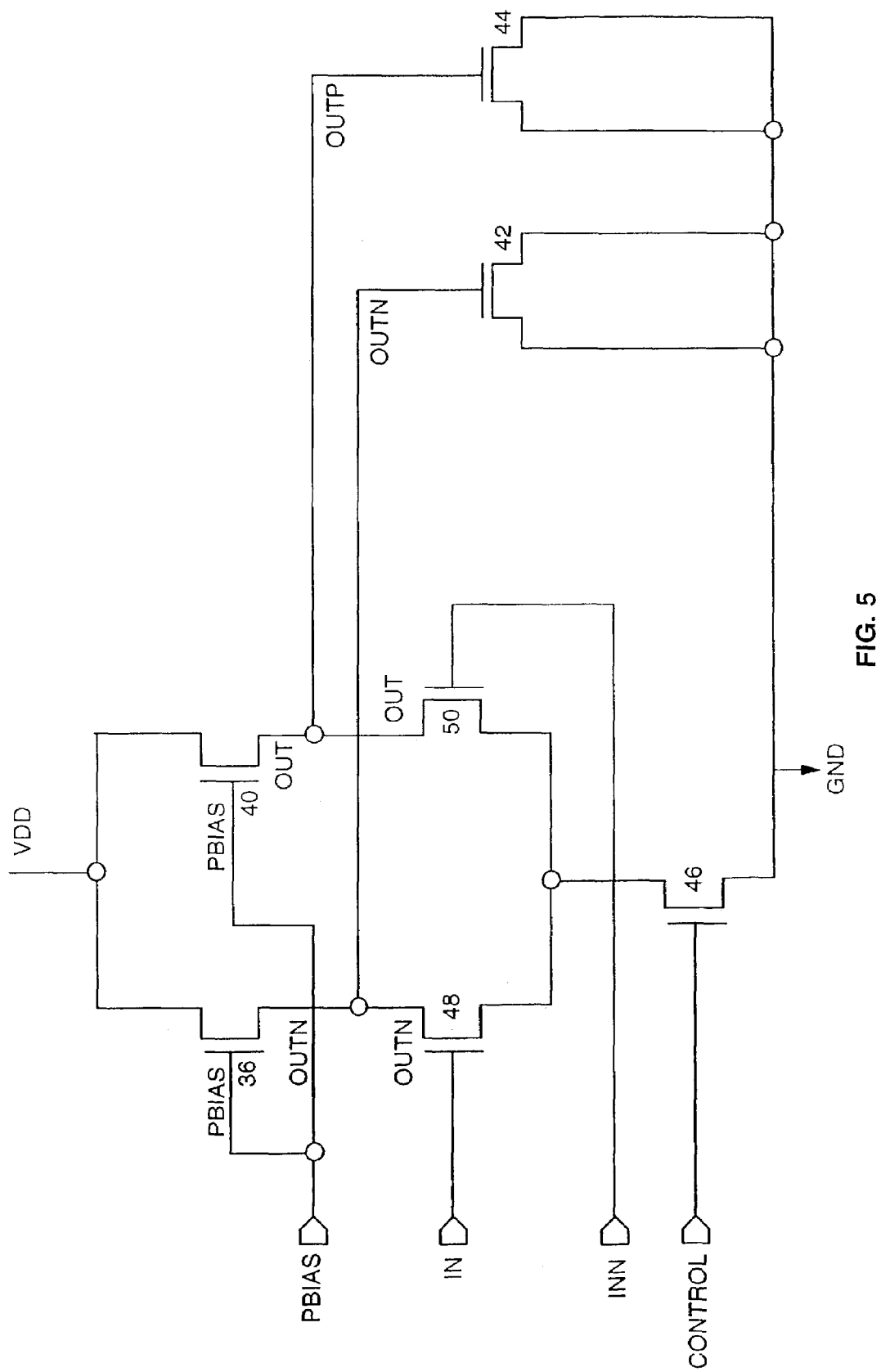
FIG. 5 shows a circuit diagram for the cell used in the Delay Line System.

FIG. 5 shows a circuit diagram for the differential delay cell used for each of the delay cell 34 (FIG. 3). It should be noted that the cells are identical, therefore the teaching of one is intended to cover all. It should also be noted that the replica delay lines are identical to the master delay line. Therefore, the differential delay cells used in the master delay line are similar to the delay cells used in the replica delay lines.

Still referring to FIG. 5, the differential delay cell includes the P-Channel devices 38 and 40 connected to supply voltage Vdd/2. The gate electrodes of the P-channel devices are connected to Pbias signal line. The drain electrodes of P-Channel Devices 38 and 40 are connected to differential pair N Channel Devices 48 and 50, respectively. The outputs from the cell is labeled OUTP for the positive signal and OUTN for the negative signal. Both outputs (OUTP and OUTN) are connected to the drain terminal of the P-Channel Devices 38 and 40, respectively. N-Channel Devices 48 and 50 have their respective base electrode connected to a signal labeled IN (representing the true portion of an input signal) and INN (representing the complement portion of an input signal). An N-Channel Device 46 acting as a sink has its gate terminal connected to a line labeled CONTROL. Its drain terminal is connected to N-Channel Devices 48 and 50, respectively. N-Channel Devices 42 and 44 are connected as capacitors with each one of their respective gate terminals connected to OUTP or OUTN and other terminals connected to the chip GND.

Figure 4:
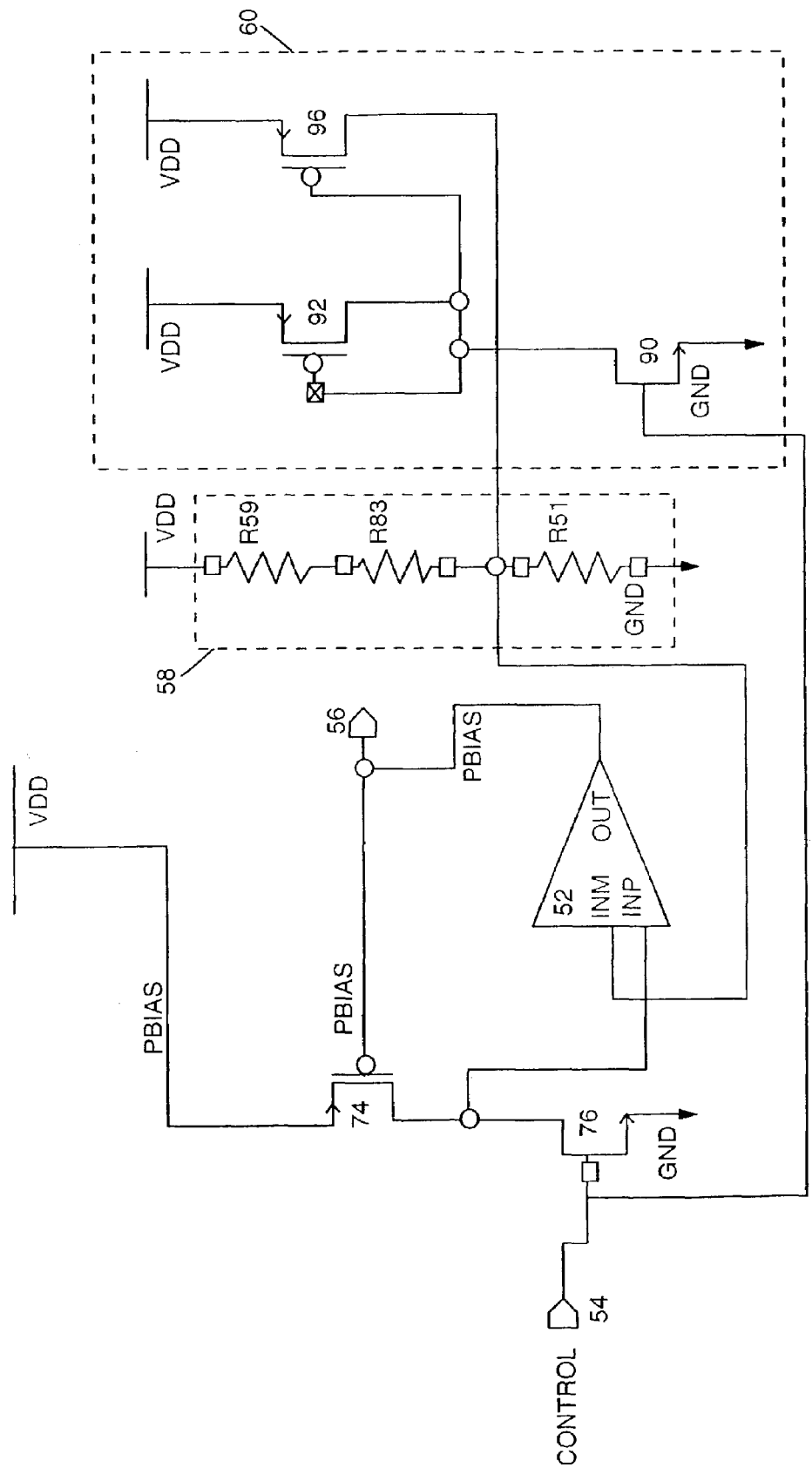
FIG. 4 shows a circuit diagram for the Pbias Generator.

FIG. 4 shows a circuit diagram for the Pbias Generator 22'''' shown in FIG. 2. The function of the Pbias generator is to receive, on terminal 54, the control voltage outputted from the phase locked loop in FIG. 2 and generate a Pbias voltage, on Terminal 56, for driving the P-channel devices in FIG. 5. The Pbias generator includes Operation Amplifier 52 with an output labeled Pbias. The Pbias output is connected to terminal 56 and the gate electrode of P-Channel Device 74. The source electrode and drain electrode of P-Channel Device 74 are connected to Vdd (power supply) and N-Channel device 76, respectively.

The N-Channel Device 76 has its source terminal connected to ground potential and its gate terminal connected to Terminal 54. One of the input terminals labeled INP of the operational Amp 52 is coupled to the drain terminals of P-Channel Device 74 and N-Channel Device 76. The other input terminal labeled INM of operational Amp 52 is connected to Resistive Network 58 and Current Mirror 60. The gate terminal of N-Channel Device 76 is coupled to N-Channel Device 90. The Resistive Network 58 includes R59, R83 and R51. Each of the R values is approximately 500 Ohms. Of course, other values could be chosen without departing from the spirit of the present invention. The Current Mirror 60 includes P-Channel Devices 92 and 96 in which the source electrodes are connected to Vdd and their gate and drain (P92 only) electrodes are connected to the collector of N-Channel Device 90. The drain terminal of P-Channel Device 96 is connected to a point within the Resistive Network 58.

The control function of the delay cell shown in FIG. 5 adjusts the resistance of the P-Channel transistors that connect the differential pair (48 and 50) of the delay cell to the positive voltage rail. In operation, the P-Channel Devices 38 and 40 are biased in their linear region, appearing functionally as adjustable resistors. These, in combination with Capacitance 42 and 44, create the delay in the cell. Adjustment of the delays is made by adjusting the current in Transistor 46. As the current increases, the delay shortens for the delay cell since a higher a currency charge out of Capacitance 42 and 44 at a faster rate. It should be noted that N-Channel Devices 42 and 44 are connected as capacitors.

Adjustment of the P-Channel devices in the delay cell is accomplished by the circuit shown in FIG. 4. Preferably, the device sizes of N-Channel Device 76 is the same as N-Channel Device 46 (FIG. 5), and in a similar fashion, the P-Channel Device 74 (FIG. 4) is sized the same as P-Channel Devices 38 and 40 (FIG. 5), respectively. In operation, Operational Amplifier 52 adjusts the bias on the gate of P-Channel Device 74 and also to all the interconnected delay cells, so as the drain voltage of P-Channel Device 74 is equal to the voltage developed by Resistor Dividers R59, R83 and R51 (set at about one-third of supply voltage). This is done to limit the voltage swing inside the delay cell. Without this adjustment to the pull-up P-Channel Devices 38 and 40, the swing inside the delay cell would increase as a control current into the cells increases. An increased swing would cause the delay produced by the delay cell to increase, and as stated above, an increase in current should shorten the delay in each delay block, not increase it. The net effect of not adjusting these resistors would be to subtractively interact with the current control adjustment and make small the total range of adjustment as could be realized by the delay blocks arranged to oscillate by the ring oscillator configuration. This would have restricted the range of frequency operation of the phase lock loop.

P-Channel Devices 92, 96 and N-Channel Device 90 will further extend the range capability of the delay blocks. As a control current in these block increases, the current in the current mirror formed by the P-Channel Devices 92, 96 and N-Channel Device 90 increases, raising the voltage produced by resistor divider and effectively shrinking the differential swing as realized inside each of the delay blocks. This is important, in that the increased range can help cover range loss by process and temperature as normally seen by the phase lock loop. This helps to guarantee the phase lock loop can operate over its intended range of frequency operation. It also makes the phase lock loop more versatile for extended frequency application where the range of operation is important.

Figure 6:
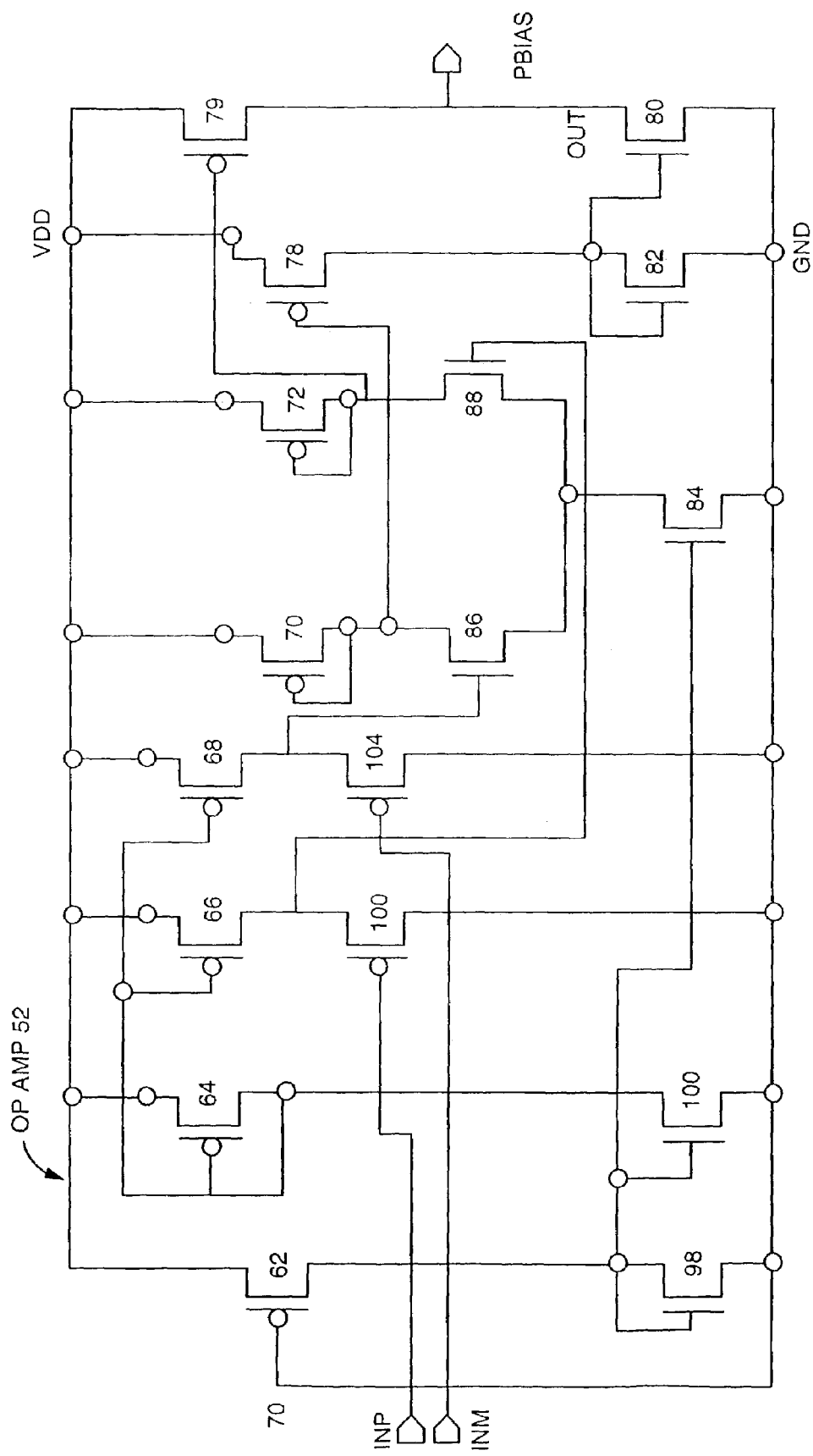
FIG. 6 shows a circuit diagram for the Pbias OP AMP of FIG. 5.

FIG. 6 shows a circuit diagram for Operational Amplifier 52 (FIG. 4). The operational amplifier includes Power Supply Node Vdd, GND, Input Nodes INP and INM, and Output Node Pbias. P-Channel Devices 62, 64, 66, 68, 70, 72, 78 and 79 are coupled by one of their respective terminals to Power Supply Voltage Vdd. P-Channel Device 62 is coupled by a second terminal to Node GND. The third terminal of P-Channel Device 62 is coupled through N-Channel Devices 98, 100 and 84 to the Terminal GND. P-Channel Transistor 64 is connected through N-Channel Device 100 to Device 100 to Node GND. P-Channel Device 66 is coupled through P-Channel Device 102 to Node GND and to N-Channel Device 88. P-Channel Device 68 is coupled through P-Channel Device 104 to Node GND. P-Channel Devices 70 and 72 are connected through differential N-Channel Devices 88 and 86 to N-Channel Device 84 which is connected to Node GND. P-Channel Device 78 is coupled through N-Channel Device 82 to Node GND. Finally, P-Channel Device 79 is coupled to the Pbias output and through N-Channel Device 82 to the GND.

Figure 8:
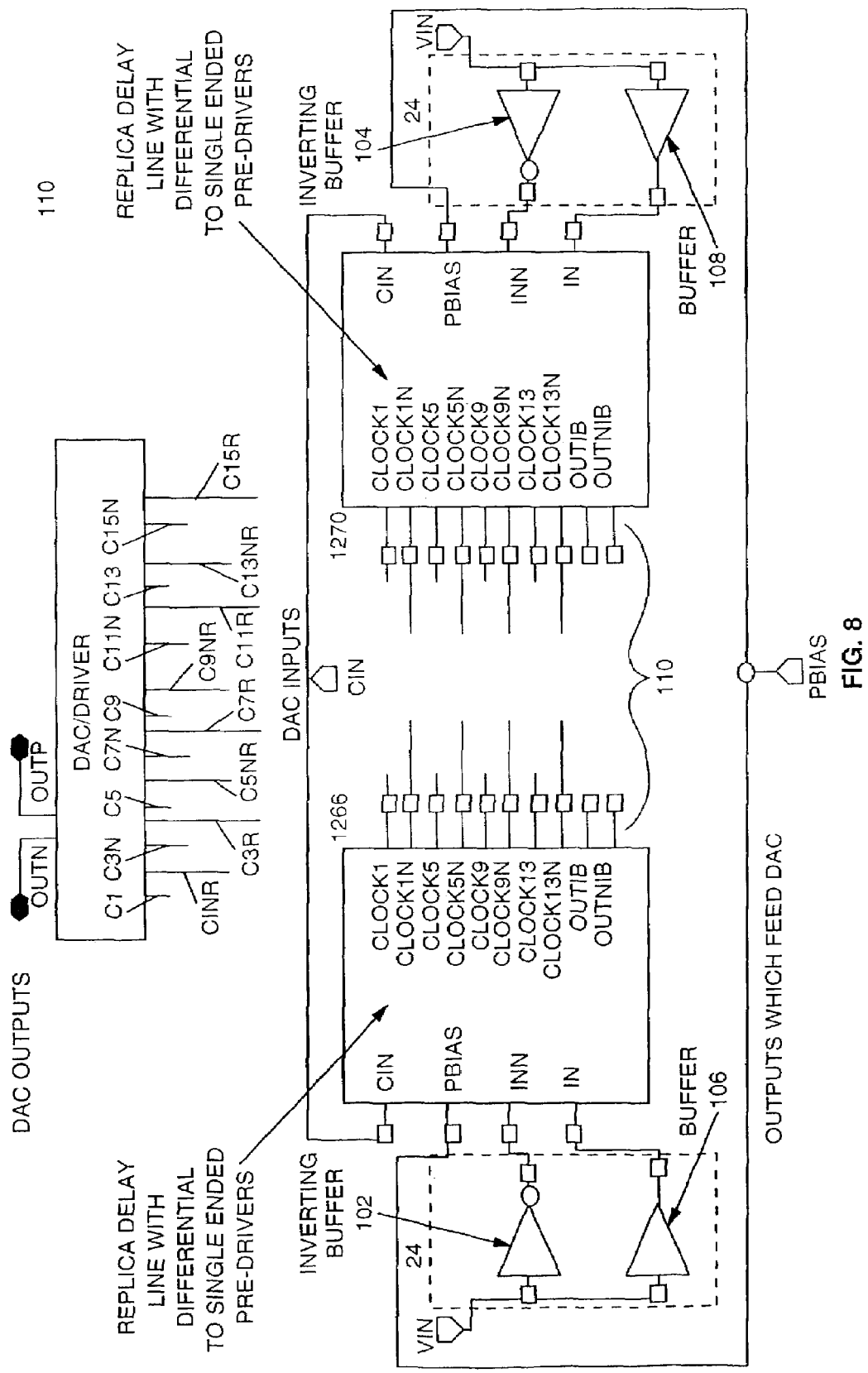
FIG. 8 shows a block diagram of the Interface System, the Replica Delay Line System and the Conversion Circuit Arrangement (DAC/DRIVER).

FIG. 8 shows a section of the waveform generating system according to the teachings of the present invention. The section includes Interface System 24, two delay lines with single-ended predrivers and digital-analog-converter (DAC/Driver). Each cell in the replica delay lines are coupled to double end drivers (details given below) and the single ended output from the double end drivers are fed to the DAC inputs. As stated previously, the replica delay lines are substantially the same as the delay line in FIG. 3. However, the feedback portion is deleted since the replica delay lines are not configured as ring oscillators.

Still referring to FIG. 8, the Interface System 24 (FIG. 1) includes Inverting Buffers 102 104 and Non-Inverting Buffers 106 and 108. The Pbias input is generated by the Pbias circuit and is used to bias the P-Channel devices in each of the delay lines. The output from the delay lines labeled 110 feeds the DAC inputs.

Figure 7A:
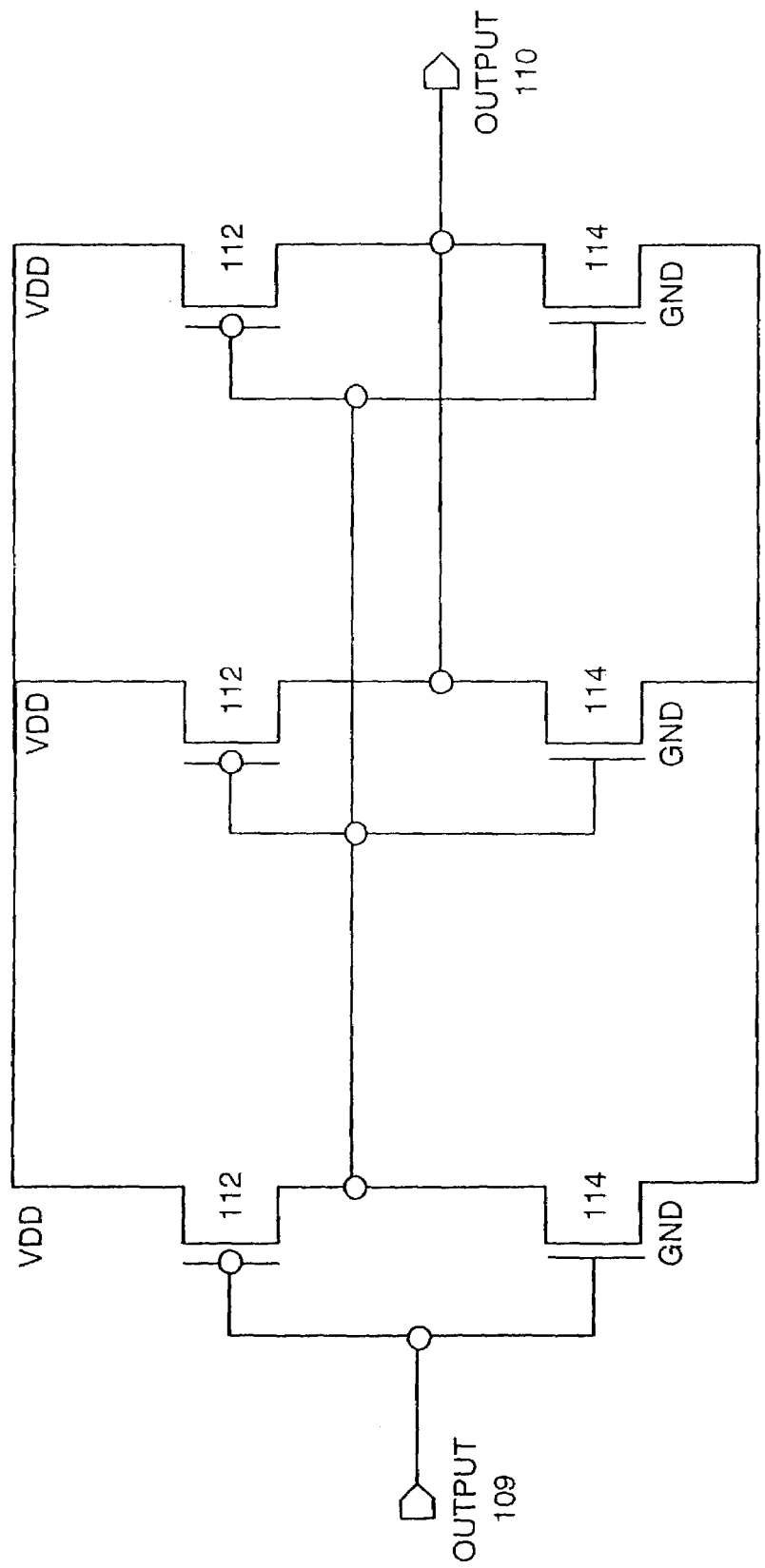
FIG. 7A shows a circuit diagram for the Non-Inverting Buffer.

FIG. 7A shows a circuit diagram for Buffers 106 and 108. The circuit has an Input Terminal 109 and Output Terminal 110. The circuit includes pairs of P-Channel devices and serially connected N-Channel Device 114 connected between Vdd and ground terminal.

Figure 7B:
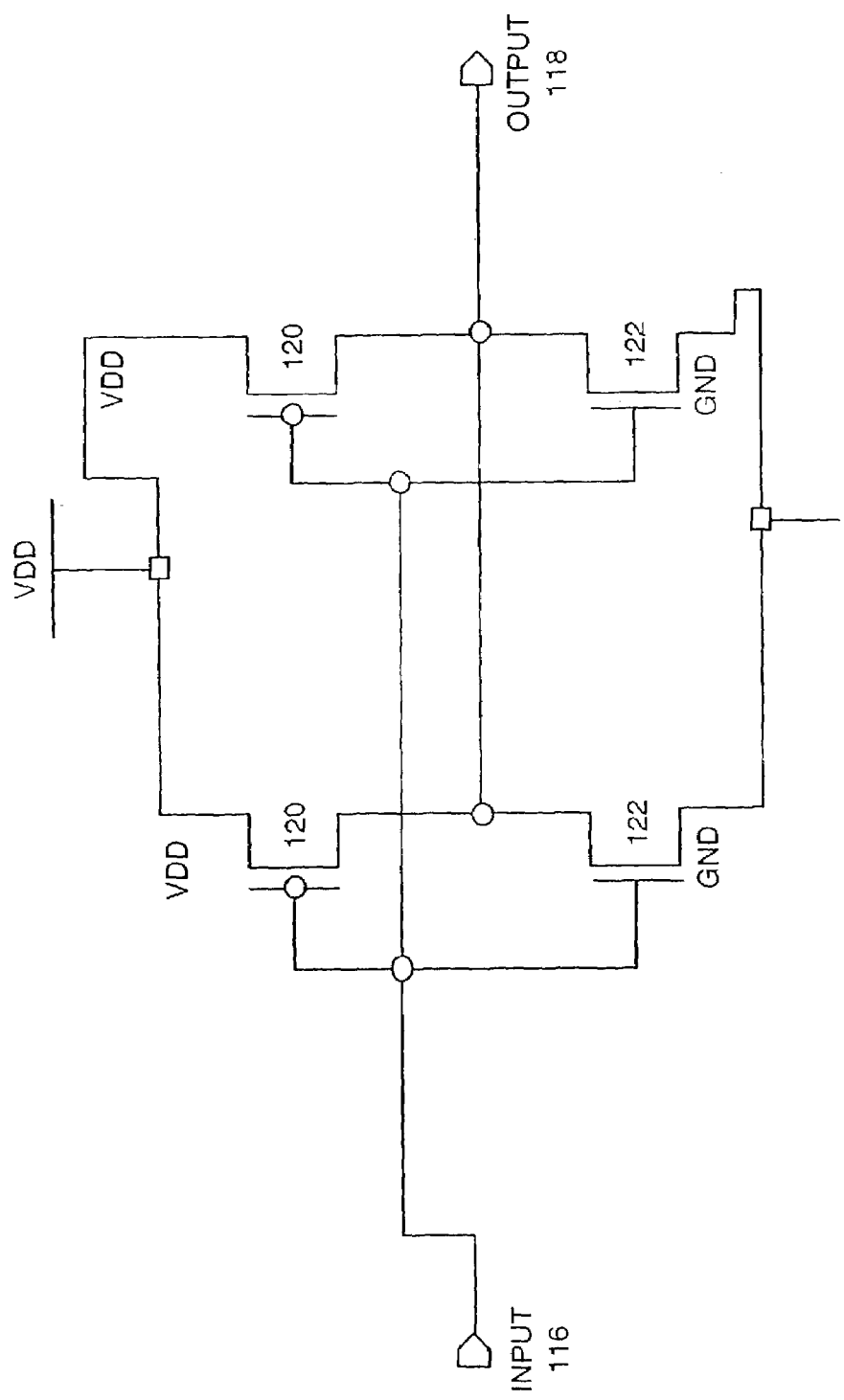
FIG. 7B shows a circuit diagram for the Inverting Buffer.

FIG. 7B shows a circuit diagram for the inverting buffer. The circuit includes Input Terminal 116, Output Terminal 118, Voltage Supply Terminal Vdd and a ground terminal. The circuit further includes two pairs of serially connected P-Channel Device 120 and N-Channel Device 122 connected between the Vdd terminal and the ground terminal.

Figure 9:
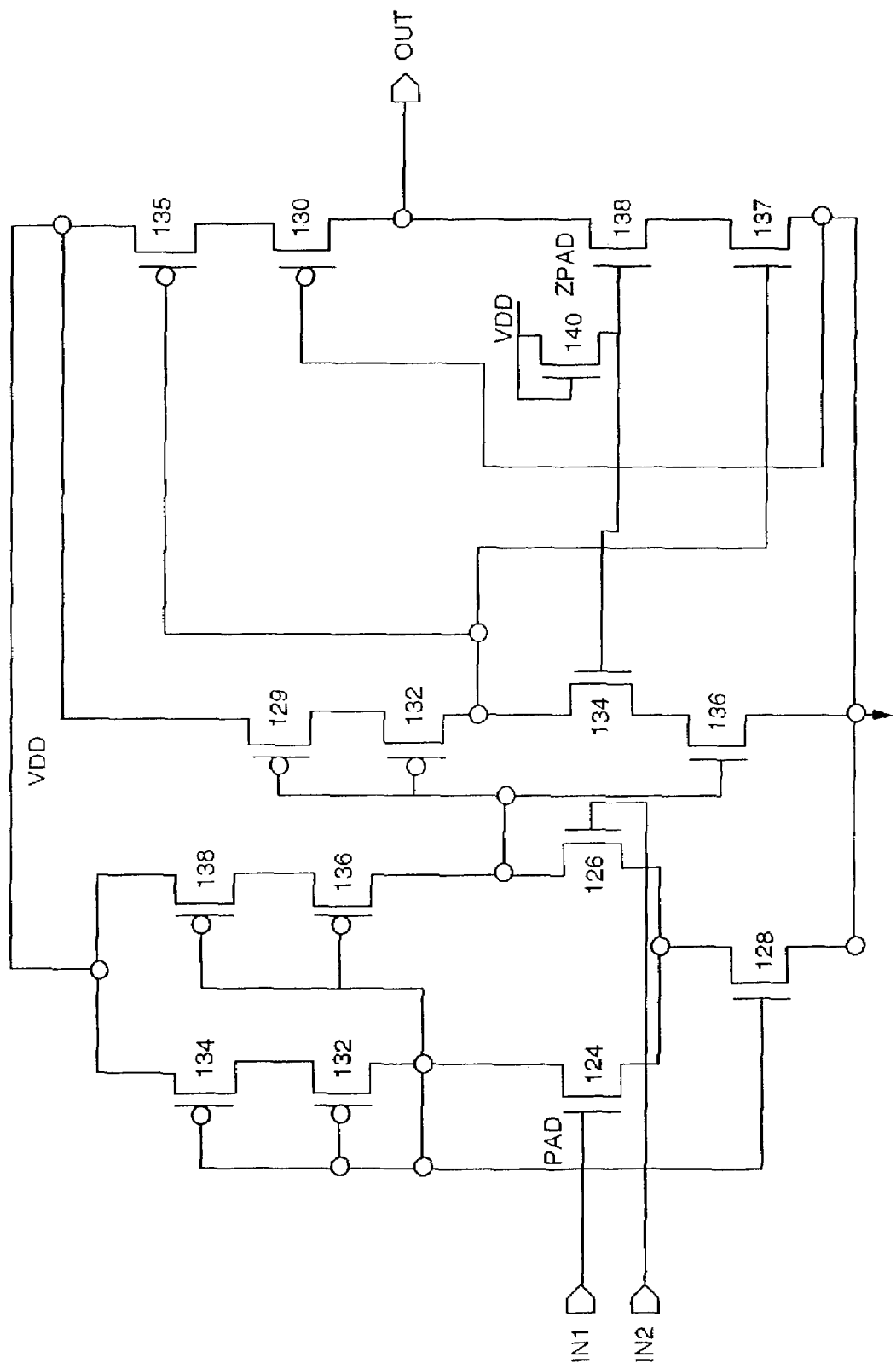
FIG. 9 shows driver circuit interfacing a Delay Line Output to an individual DAC input.

FIG. 9 shows a circuit diagram of the differential to single ended predriver which interfaces each delay line and drives individual DAC inputs. The predriver circuit includes differential pair N-Channel Devices 124 and 126. The N-Channel Devices 124 and 126 are connected to input lines labeled IN1 and IN2. The IN1 input terminal represents the true portion of the signal, and the IN2 represents the complement portion of the signal. N-Channel Devices 128 and 130 couple the differential pair to a voltage supply Vdd/2.

The N-Channel Devices 124 is coupled by a pair of P-Channel Devices 132 and 134 to positive voltage supply terminal Vdd/2. Likewise, N-Channel Device 126 is coupled by P-Channel Devices 136 and 138 to voltage supply Vdd/2. The N-Channel Device 126 is coupled through a stack of P-Channel Devices 129, 132 and N-Channel Devices 134 and 136 to the GND. The P-Channel Devices 129 and 132 are coupled by P-Channel Devices 135, 130 and 138 to N-Channel Device 137. N-Channel Device 137 is coupled through N-Channel Devices 138 and 140 to Vdd/2. The output from the differential single ended predriver is outputted on the terminal labeled OUT. As stated previously, each output is used for driving a switching element within the DAC.

Figure 10:
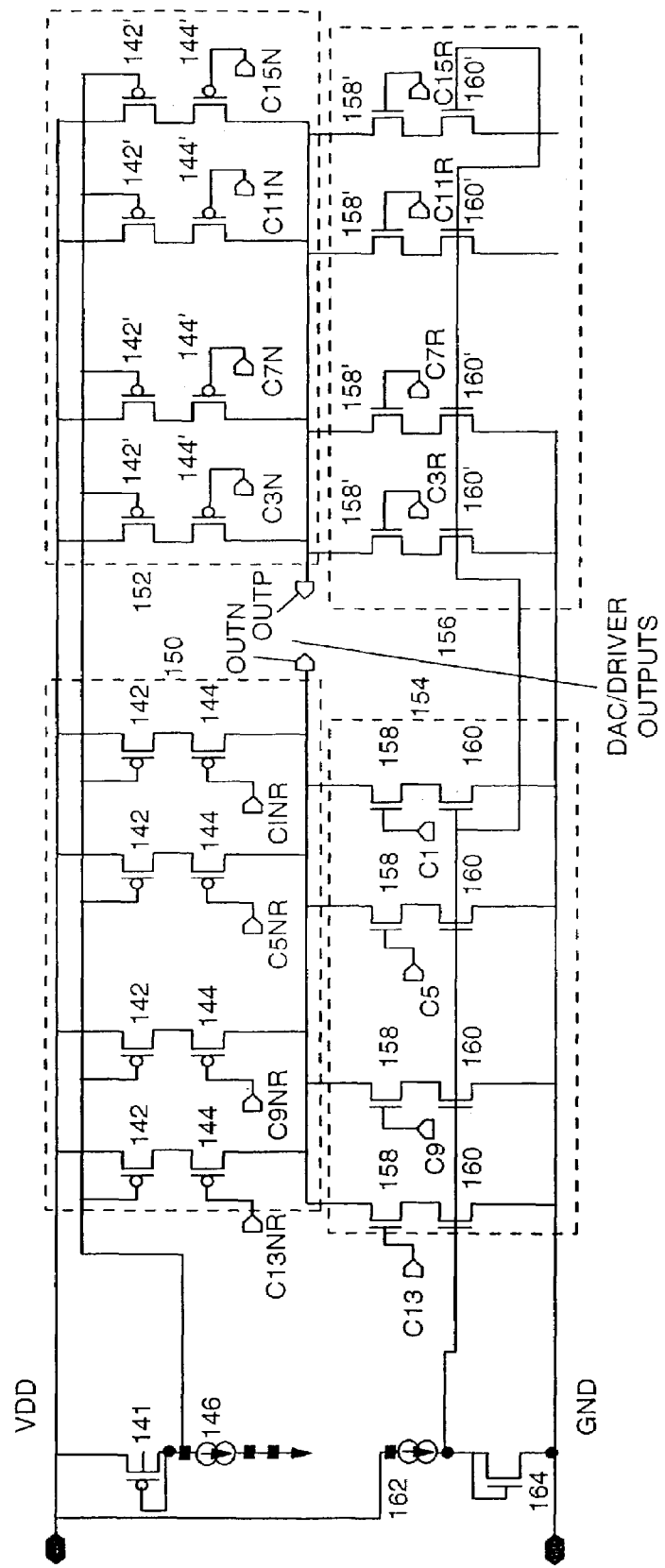
FIG. 10 shows a circuit diagram for the DAC/Driver.

FIG. 10 shows a circuit diagram for the DAC Driver (FIG. 8). The DAC Driver includes a plurality of switched current sources formed by P-Channel Devices 142 and 144, respectively. The P-Channel Device 142 is connected as a diode and mirrors current from Current Source 146. P-Channel Device 144 is connected as a switch and is activated by single ended signal outputted from its connected double ended to single ended driver (FIG. 9). P-Channel Device 148 is configured as a diode and interconnects Current Source 146 to Vdd supply. The current source switch arrangements are arranged in Quadrants 150, 152, 154 and 156. The components in Quadrant 152 comprise P-Channel devices configured as diode and switch. The notation 142' and 144' are used to differentiate the devices in Quadrant 150 from those in Quadrant 152. However, the operation of these devices are identical. The devices in Quadrant 156 and Quadrant 154 are N-Channel devices interconnected in a current source switch arrangement similar to the ones in Quadrant 150. In particular, N-Channel Device 158 functions as a switch and N-Channel Device 160 functions as a diode to mirror current from Current Source 162. N-Channel Device 164 couples the Current Source 162 to ground. The components in Quadrant 154 are substantially similar to those in Quadrant 156 and are labeled with prime notations to indicate that they are in a different quadrant. The current sources are switched sequentially. After passing through external passive networks, current flows out of the upper Quadrant 150 and into lower right hand Quadrant 156, and vice versa. Similarly, current flows from the components in Quadrant 152 to Quadrant 154 and vice versa.

Referring again to FIG. 2, the analog waveform outputted from the DAC Driver output is fed into the Filtering Network 30. The Filtering Network 30 includes Resistor RT1 connected in series with Resistor RT2. Capacitor C1 connects a point midway between Resistors RT1 and RT2 to a ground potential, and a voltage supply circuitry generates one-half the Vdd voltage and provides bias for the filtering network circuit. The output from the filtering circuit is coupled by Coupler 32 to the transmission media. In the preferred embodiment, the coupler is an inductive connection to the transmission media which could be twisted pair or any other type of transmission media.

Figure 11:
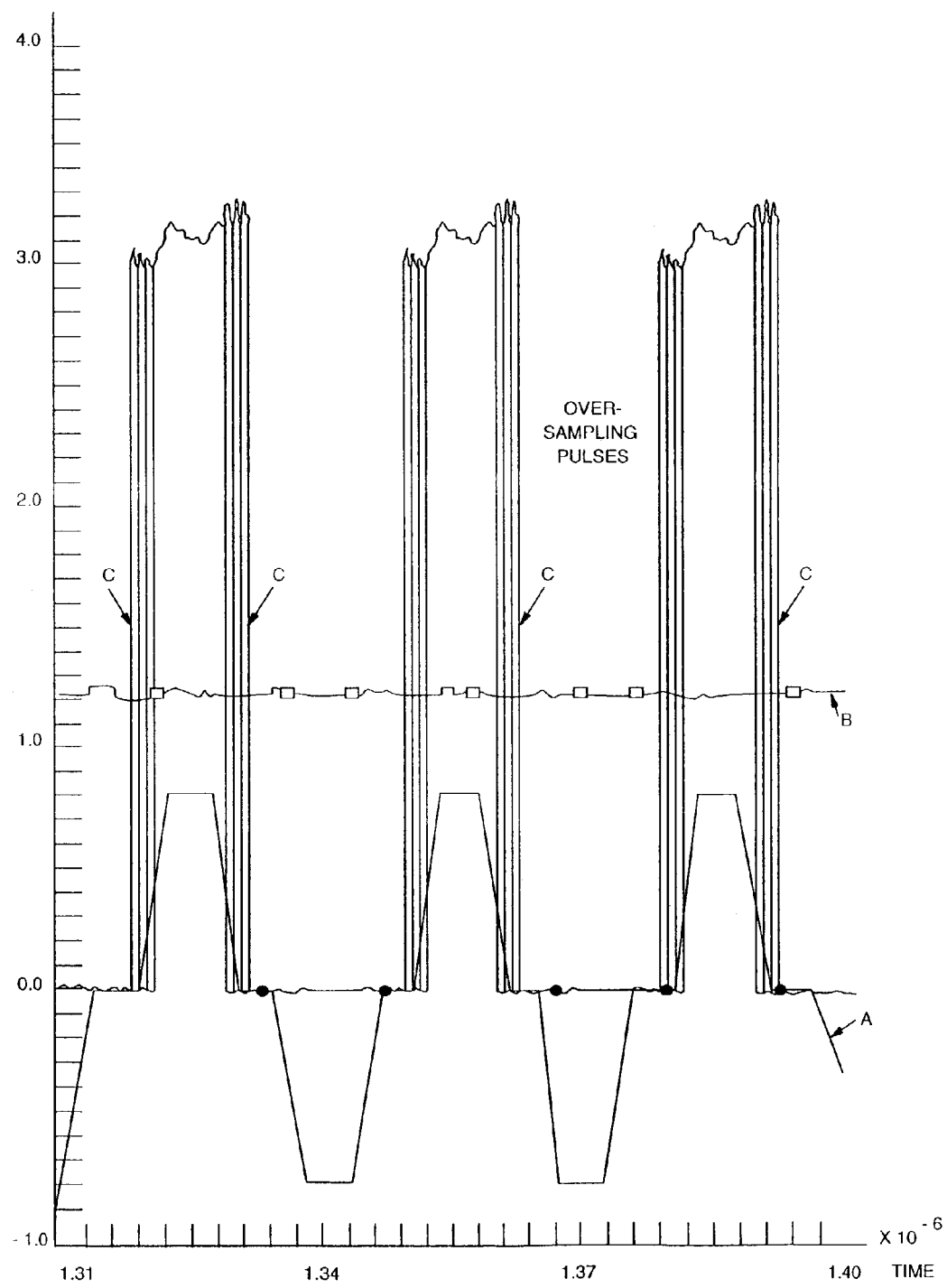
FIG. 11 shows a schematic of the waveforms.

FIG. 11 shows a schematic of the waveforms generated by the waveform generating circuit of the present invention. The wave form labeled A represents the output from the DAC/Driver; the one labeled B represents the output fro the Delay Phase Lock Loop; and the ones labeled C represent a selected set of outputs from the double ended to single ended pre-drivers.

The differential driver system described herein is intended to provide a mechanism for driving twisted pair cables with precise control of rise times of the waveform such that minimal complexities required in the off-chip magnetics. The circuit is also designed to force the pertinent circuit performance parameters to specific values by tying those parameters to a clock frequency instead of circuit or process parameters. In the present situation, the important parameter for both high-speed ethernet and for gigabit ethernet is a rise time (and fall time) of the signal as it changes state. The design solves the problem for high-speed ethernet, but the technique is equally applicable to gigabit ethernet on copper cables (or high-speed Token Ring) as well. The driver portion itself is a push-pull driving and is intended to present switch current sources to the differential output which are, in turn, fed to the external network of impedances to form the waveforms.

This technique implements the appropriate analog circuit design and derives the required performance by using a method which has immunity to process variations. The design is also migratable to future generations of CMOS technology since it is less dependent on process parameters than a traditional analog approach. The precise rise time of the circuit is accomplished internal to the chip via current sources which are switched on and off sequentially during the rise and fall of the waveform. The current sources are weighted and their timing control by the timing of replica delay lines so as to provide the control of the rise time of the output during its entire excursion. Current sources may be weighed in the manner which is appropriate to the specific transmission system requirements and their number may be increased or decreased depending on the required granularity in rise time control.

Operationally, the voltage control delay elements are used to provide a mechanism of setting delays for both the master delay line and for the replica delay lines. The master delay line is configured as a ring oscillator and is made to be part of a phase lock loop. It is important that the master and slave delay lines be matched so that the delay characteristics of the master are always found on the replica delay line. The configuration of the master delay line forms a ring oscillator whose frequency is set by the control voltages and the differential delay elements. The reference clock (125 Mhz) and a frequency from the ring oscillator are fed to the phase/frequency detector. The phase/frequency detector controls the charge pump control and current pump circuit. The charge pump in turn feeds the loop filter which is gradually charged for stable level of the control voltage when it reaches the point at which the reference frequency and the ring oscillator frequency are the same. When this operational point is achieved, the delay per stage of the delay line is then forced to be fraction of the period of the reference frequency (in this case shown as T/2N where T is a time period of the reference and N is a number of delay stages).

This delay is then replicated in the delay per stage of the replica. The delays are then converted to single ended signals and are used to set times at which the drivers switched current sources may be activated or deactivated by the data signal. The net effect is an over sampled building of the waveform at an equivalent lock rate of 2/(delay per stage of the delay elements). In the present design point, the rise and fall of the signal is controlled by one nanosecond intervals (equivalent to 1 Ghz clocked logic) with a 125 Mhz input clock frequency. Additionally, the delay per stage may be varied by changing the reference lock frequency within certain bounds. This can provide a measure of programmability to the delay which can be implemented on the logic or software control. As part of the teaching of this invention, it can be seen that by using a higher clock frequency and a larger number of time sample segments, as well as a larger number of current sources sequentially controlled by the delay elements, that a transmit waveform of arbitrary complexity may be waveshape with a very high apparent over sampled rate while using clock frequency that are a fraction of this apparent over sampled rate.

While the invention has been described in terms of preferred embodiments, those skilled in the art will recognize that the invention can be practiced with modification within the spirit and scope of the appended claims.

Having thus described our invention, what we claim is as follows:

1. A Network Interface Card (NIC) for coupling a device to a communications network including:
    a system interface section with functional circuits that process information so that said information can be received and forwarded to a system bus;
    a Medium Access Controller (MAC) storing and executing Medium Access Layer functions wherein information is being transferred or received in accordance with a predetermined protocol; and
    a Network Interface section including a receiver and a signal generator; said signal generator including a Phase Lock Loop (PLL) with a master delay line system operatively coupled to at least one replica delay line system wherein said PLL generating equally spaced pulses that gate data signal through said replica delay line system.

2. The NIC of claim 1 wherein the predetermined protocol includes Token Ring or ethernet or ATM.

3. The NIC of claim 1 further including a filtering network coupled to the at least one replica delay line system; and
    a coupler connecting the filtering network to the communications network.

4. The NIC of claim 3 wherein the coupler includes a transformer.

5. The NIC of claim 3 wherein the filtering network includes a pair of series connected resistors; and
    a capacitor interconnecting a point intermediate, the series connected resistors to a first reference voltage level.

6. The NIC of claim 5 further including a reference voltage generator coupled to the point and the capacitor.

7. The NIC of claim 1 wherein the master delays line system is configured as a ring oscillator.

8. The NIC of claim 1 wherein the master delay line system includes a plurality of delay cells connected in series; and
    at least one double ended to single ended driver circuit operatively coupled between at least one pair of delay cells.

9. The NIC of claim 8 wherein the delay cells are configured into a ring structure.

10. The NIC of claim 1 further including a conversion circuit arrangement operatively coupled to the at least one replica delay line system.

11. The NIC of claim 8 wherein the replica delay line system is substantially identical to the master delay line system.

12. The NIC of claim 1 wherein said master delay line system is provided within the phase lock loop.

13. The NIC of claim 12 wherein said replica delay line system is provided external to said PLL.

* * * * *